United States Patent
Sato

(10) Patent No.: US 9,044,929 B2
(45) Date of Patent: Jun. 2, 2015

(54) PRINTING APPARATUS

(75) Inventor: Hidetoshi Sato, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 317 days.

(21) Appl. No.: 13/468,434

(22) Filed: May 10, 2012

(65) Prior Publication Data

US 2012/0285378 A1    Nov. 15, 2012

(30) Foreign Application Priority Data

May 13, 2011   (JP) ................................. 2011-107808

(51) Int. Cl.
| | | |
|---|---|---|
| B05C 11/00 | (2006.01) | |
| C23C 16/52 | (2006.01) | |
| B41F 15/08 | (2006.01) | |
| H05K 3/00 | (2006.01) | |
| H05K 3/12 | (2006.01) | |

(52) U.S. Cl.
CPC ....... *B41F 15/0881* (2013.01); *B41P 2215/112* (2013.01); *B41P 2215/114* (2013.01); *H05K 3/0008* (2013.01); *H05K 3/1233* (2013.01)

(58) Field of Classification Search
None
See application file for complete search history.

(56) References Cited

U.S. PATENT DOCUMENTS

| | | | | |
|---|---|---|---|---|
| 2002/0050061 A1* | 5/2002 | Komyoji et al. | ................ | 29/846 |
| 2003/0021886 A1 | 1/2003 | Barle | | |
| 2007/0081695 A1* | 4/2007 | Foxlin et al. | .................. | 382/103 |
| 2009/0199729 A1* | 8/2009 | Aiba | ............................. | 101/129 |

FOREIGN PATENT DOCUMENTS

| | | |
|---|---|---|
| EP | 2 039 511 A1 | 3/2009 |
| JP | 2006-281680 A | 10/2006 |

OTHER PUBLICATIONS

The extended European Search Report dated Aug. 10, 2012; EP Application No. 12003758.2-2304.

* cited by examiner

*Primary Examiner* — Charles Capozzi
(74) *Attorney, Agent, or Firm* — Studebaker & Brackett PC

(57) ABSTRACT

Disclosed is a printing apparatus which comprises: a base; a frame member installed on the base; a printing section supported by the frame member to subject a board to printing; a board conveying segment provided on the base displaceably; a control section for controlling the driving of the board conveying segment; a mark provided on the frame member; and an image pickup section mounted on the board conveying segment to pick up an image of the mark, wherein the control section is operable to cause the board conveying segment to be displaced so as to allow a board to be set in the printing zone, and, based on the image of the mark picked up by the image pickup section, to perform a strain compensation for correcting an error in displacement of the board conveying segment due to a strain of the driving mechanism.

10 Claims, 12 Drawing Sheets

9,044,929 B2

PRINTING APPARATUS

BACKGROUND OF THE INVENTION

1. Field of the Invention

The present invention relates to a printing apparatus comprising a printing section for subjecting a board to printing.

2. Background Art

Heretofore, as a printing apparatus for subjecting a board to printing, there has been known a screen printing machine designed to print solder paste onto a workpiece (target object) fixed on a table, through a mask (screen mask), as disclosed, for example, in JP 2006-281680A.

In a screen printing machine disclosed in this publication, at least two error-compensating readable marks are provided at respective positions on an upper surface of a workpiece (target object) holding table. Further, a camera is disposed above the workpiece (target object) holding table in such a manner as to be displaceable parallel to the upper surface of the table. During printing, an image of the two readable marks is picked up by the camera, and a distance between the readable marks is measured from the image to detect a strain of the table (elongation and contraction of the table caused by temperature/humidity changes), so that it becomes possible to perform a strain compensation for the table.

However, in the above conventional screen printing machine, depending on a size or outer shape of the workpiece (target object), one or more of the readable marks are likely to be covered by or hidden behind the workpiece, because the readable marks are provided on the upper surface of the workpiece (target object) holding table. In this case, it is impossible to pick up an image of the marks so as to measure a distance between the marks, at least unless the workpiece is removed from above the readable marks.

Meanwhile, a strain of the table will occur along with a continuous printing operation. Thus, it is desirable that the strain compensation is performed at an appropriate timing, irrespective of the progress or status of the printing operation. However, in the conventional screen printing machine, the strain compensation can be performed only at a limited timing, because an image of the readable marks cannot be reliably picked up unless the workpiece is removed from the table. Thus, there is a problem that the strain compensation timing is extremely restricted.

SUMMARY OF THE INVENTION

In a printing apparatus capable of detecting a strain occurring in a mechanism section to compensate for the strain, it is an object of the present invention, particularly, to enhance the flexibility of strain compensation timing to allow the strain compensation to be performed at a more adequate timing.

According to one aspect of the present invention, there is provided a printing apparatus which comprises: a base; a frame member fixedly installed on the base; a printing section supported by the frame member to subject a board to printing; a board conveying segment provided on the base displaceably within a range including a printing zone where the printing is performed by the printing section, to convey a board; a driving mechanism for driving the board conveying segment; a control section for controlling the driving of the board conveying segment by the driving mechanism; a mark provided on the frame member; and an image pickup section mounted on the board conveying segment to pick up an image of the mark, wherein the control section is operable to cause the board conveying segment to be displaced so as to allow a board to be set in the printing zone, and, based on the image of the mark picked up by the image pickup section, to perform a strain compensation for correcting an error in displacement of the board conveying segment due to a strain of the driving mechanism.

DETAILED DESCRIPTION OF THE PREFERRED EMBODIMENTS OF THE INVENTION

The present invention will now be described based on the drawings illustrating an embodiment thereof.

First of all, a printing apparatus 100 according to one embodiment of the present invention will be described with reference to FIGS. 1 to 10.

Figure 1:
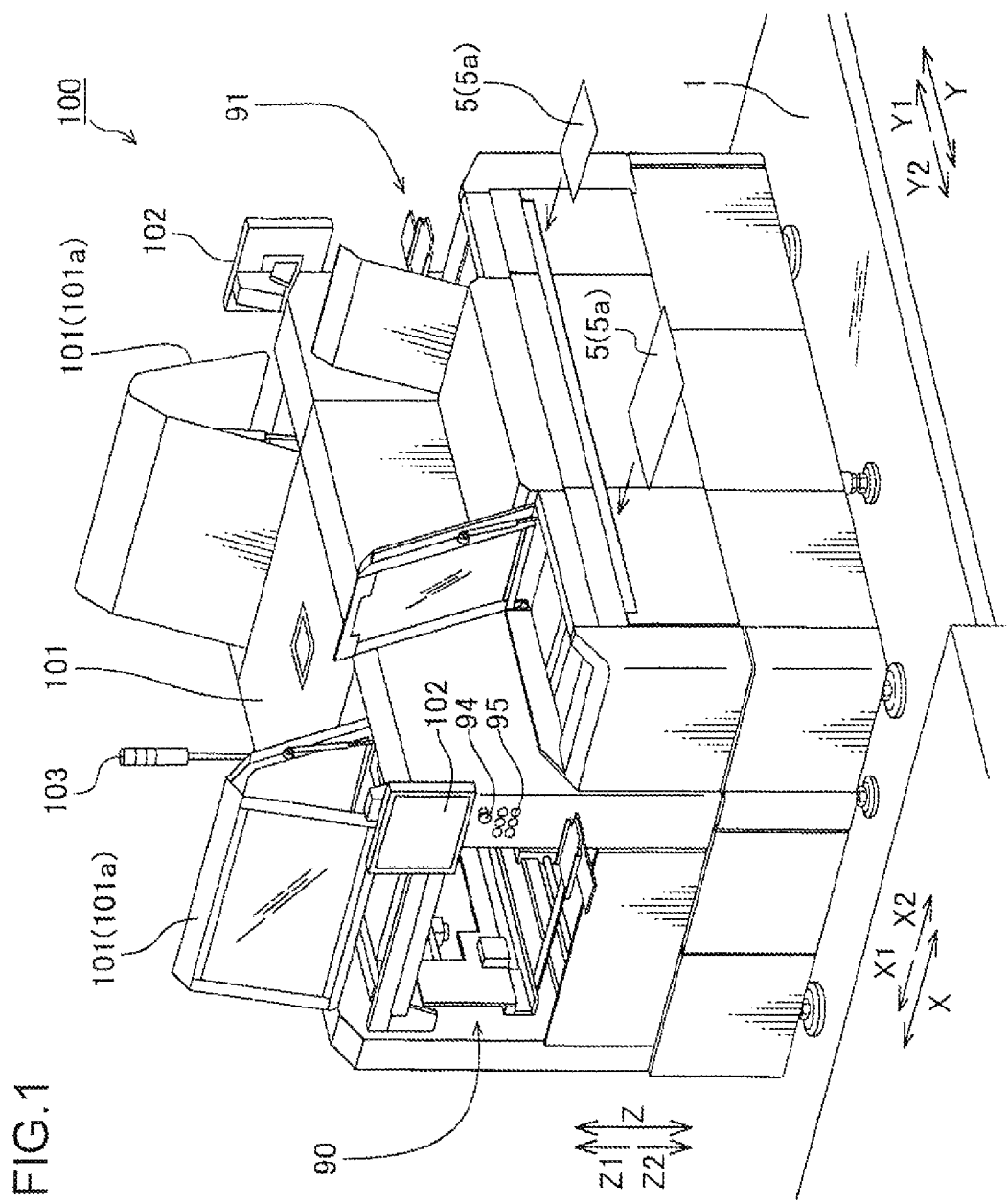
FIG. 1 is a perspective view illustrating a general appearance of a printing apparatus according to one embodiment of the present invention.

As illustrated in FIG. 1, the printing apparatus 100 according to this embodiment is a printing machine designed to screen-print (print, through a screen mask,) solder paste onto an upper surface 5a of a printed board (printed wiring board) 5 conveyed into an apparatus body. The printing apparatus 100 is installed on a floor 1 (X-Y plane). The printing apparatus 100 is equipped with two printing units 90, 91, and operable to drive the printing units 90, 91 individually to subject a printed board 5 to screen printing in a respective one of the printing units 90, 91. The printing units 90, 91 are configured such that, during the screen printing, they can print on two types of printed boards 5 different in size, respectively. In this embodiment, the printed board 5 serves as one example of "board" set forth in the appended claims.

Figure 2:
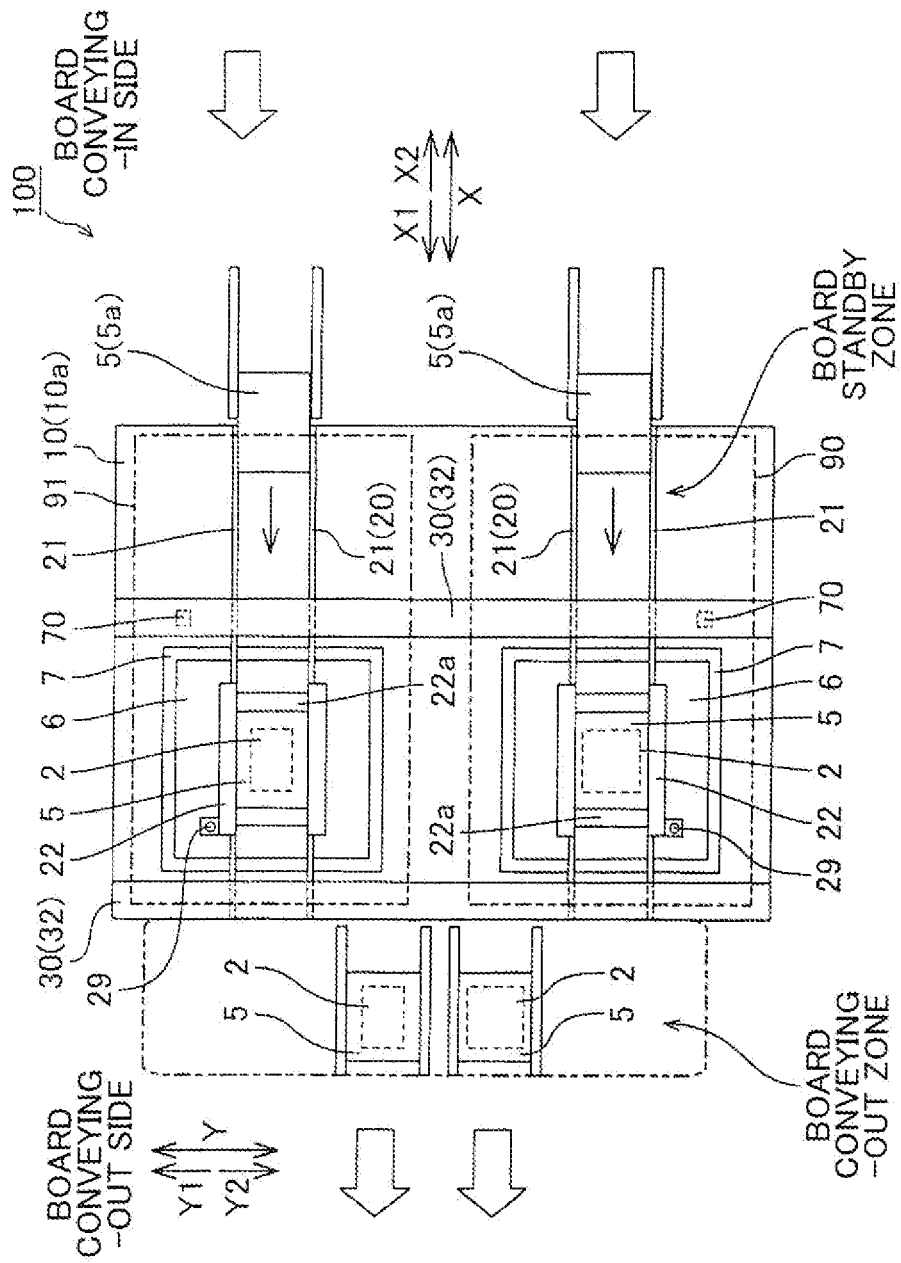
FIG. 2 is a top plan view illustrating a schematic layout of the printing apparatus according to the above embodiment.

As illustrated in FIG. 2, the printing apparatus 100 is installed such that the two printing units 90, 91 are disposed on a base 10 mounted on the floor 1 (see FIG. 1), in side-by-side relation along a Y direction, in top plan view. Each of the printing units 90, 91 is disposed such that a longitudinal direction thereof corresponding to a board conveying-in/conveying-out direction along which a printed board 5 is conveyed into and out from the printing unit 90 (91), is approximately aligned with an X direction of the base 10. In the printing unit 90 (91), the X direction corresponds to a board conveying direction along which a printed board 5 is conveyed, and the Y direction corresponds to a printing direction along which solder 2 (see FIG. 5) is printed onto a printed board 5. The X direction and the Y direction are directions orthogonally intersecting each other on the base 10.

In the printing unit 90 (91), the right side (X2-directional side) in FIG. 2 corresponds to a board conveying-in side from which a printed board 5 is conveyed into the printing unit 90 (91), and the left side (X1-directional side) in FIG. 2 corresponds to a board conveying-out side from which a printed board 5 is conveyed out from the printing unit 90 (91). Further, a zone located just above the base 10 and rightward of a portion of an aftermentioned frame structure 30 (beam portion 32) on the right side in FIG. 2 is a standby zone for a printed board 5 before printing (pre-printing printed board 5). On the other hand, a zone located leftward of a portion of the aftermentioned frame structure 30 (beam portion 32) on the left side in FIG. 2 is a conveying-out zone for a printed board 5 after completion of the printing (post-printing printed board 5). A zone between the right and left beam portions 32 corresponds to a printing zone for a printed board 5. The two printing units 90, 91 have substantially the same configuration, and therefore only the configuration of the printing unit 90 on a front side (Y2-directional (forward) side) will be described below.

Figure 3:
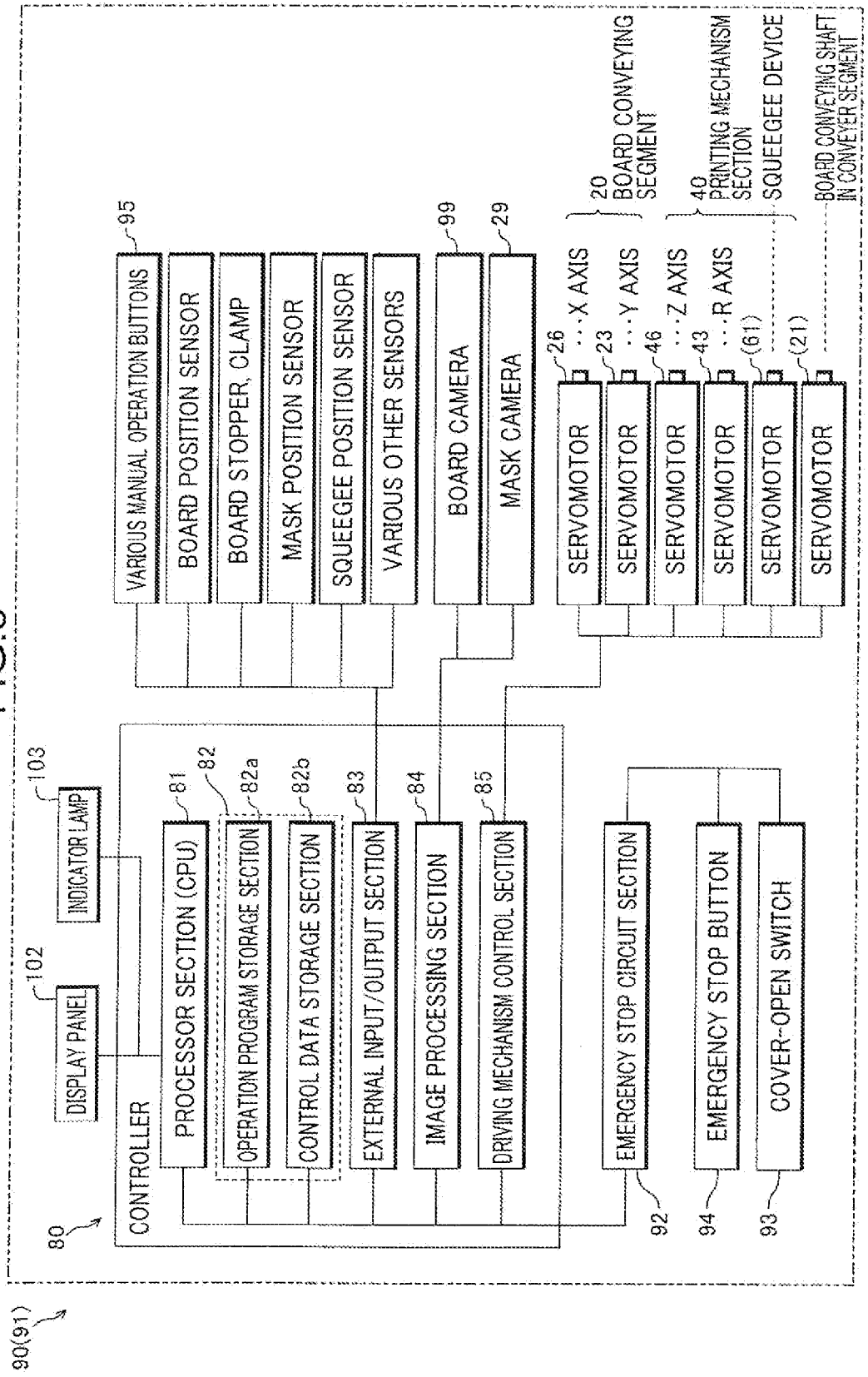
FIG. 3 is a block diagram illustrating a configuration of each of two printing units in the printing apparatus illustrated in FIG. 1.
Figure 4:
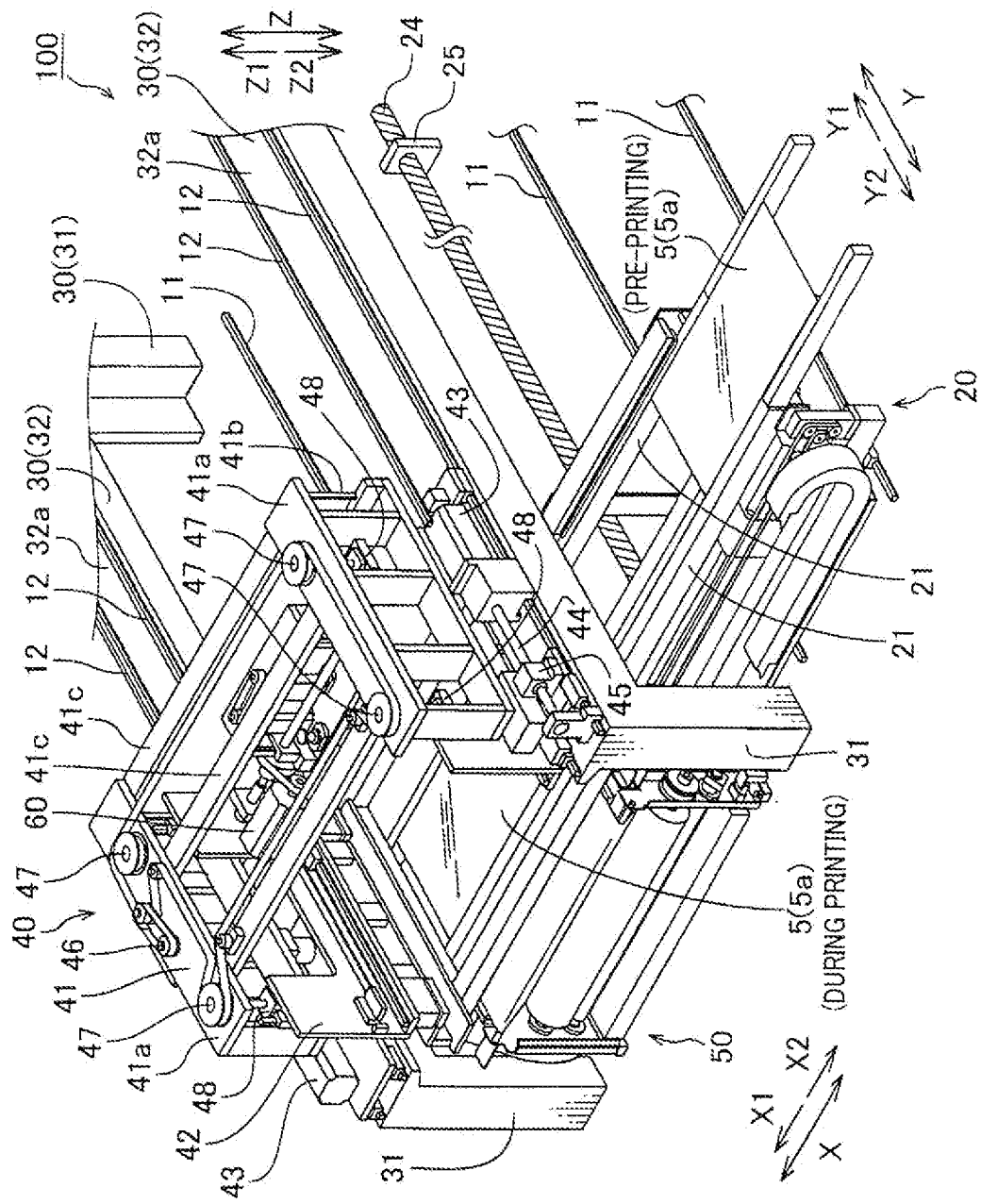
FIG. 4 is a perspective view illustrating an internal structure of a front one of the printing units in the printing apparatus.

FIG. 4 illustrates a printing unit 90 in a state after removal of a plurality of outer covers 101 (see FIG. 1) covering the printing apparatus 100. As illustrated in FIG. 4, the printing unit 90 comprises a conveying mechanism section 20 for conveying a printed board 5, a frame structure 30 fixedly installed on the base 10, a printing mechanism section 40, and a cleaner section 50. FIG. 4 omits an illustration of the base 10 (see FIG. 2) on which the conveying mechanism section 20 and the frame structure 30 are installed. As illustrated in FIG. 3, the printing apparatus 100 further comprises a controller 80 which is housed therein to control an operation of each section as described later. In this embodiment, the frame structure 30 serves as one example of "frame member" set forth in the appended claims, and the printing mechanism section 40 serves as one example of "printing section" set forth in the appended claims.

The conveying mechanism section 20 has a function of conveying a pre-printing printed board 5 conveyed into the printing unit 90, to the printing zone. In this embodiment, the printing zone means a zone where a screen mask 6 (see FIG. 7) is placed on an upper surface 5a of a printed board 5 during printing. The frame structure 30 is fixed to an upper surface 10a of the base 10 (see FIG. 2) while striding over the conveying mechanism section 20 in the Y direction. The printing mechanism section 40 has a function of printing solder 2 on a portion (inside the broken line illustrated in FIG. 5) of the upper surface 5a of the printed board 5. The printing mechanism section 40 is attached to the frame structure 30 in such a manner as to be displaceable above the frame structure 30 and along the printing direction (Y direction). The cleaner section 50 has a function of wiping out excess solder paste adhered to a lower surface (a surface oriented in a Z2 direction) and a plurality of mask openings of the screen mask 6 (see FIG. 7) after completion of the printing.

Figure 5:
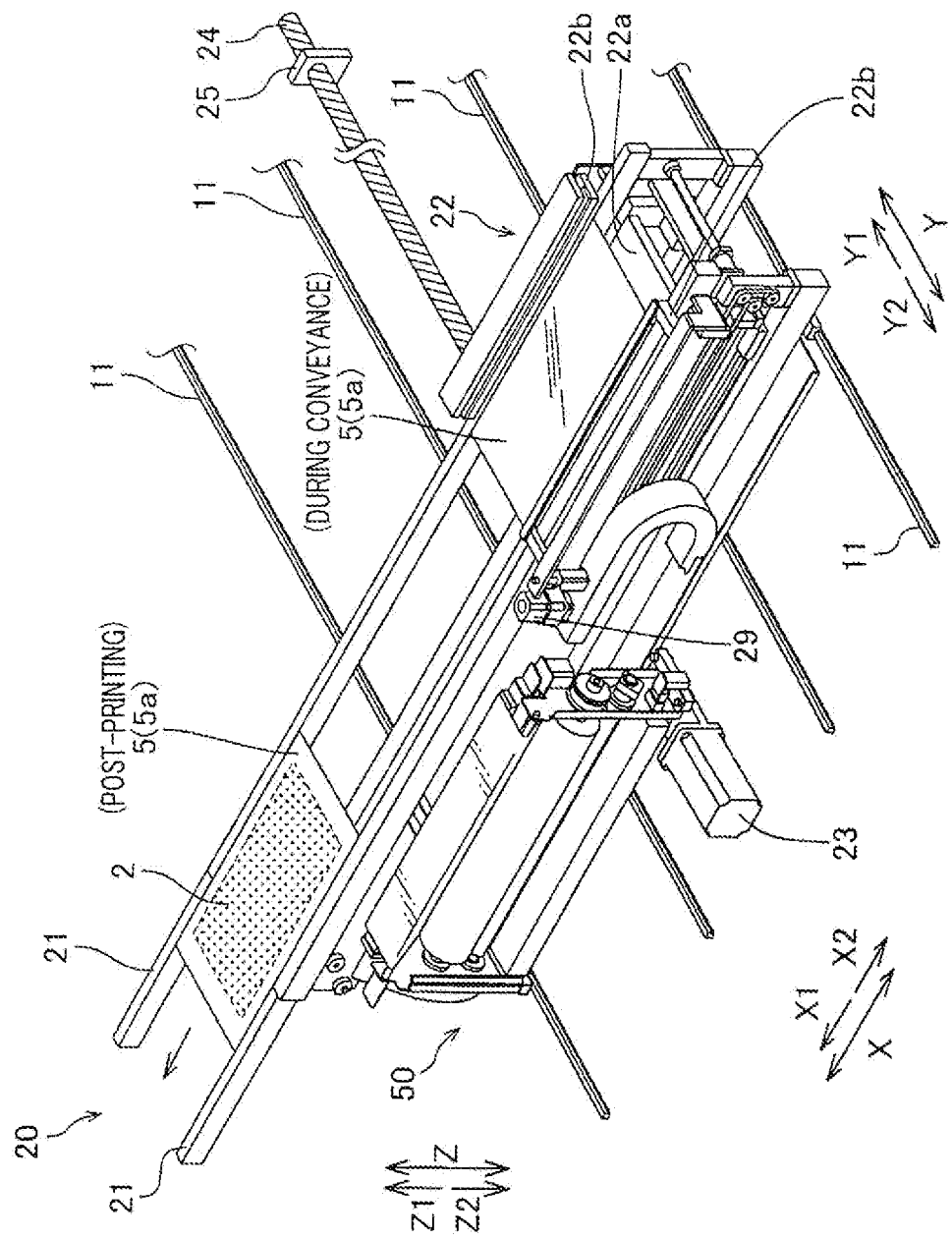
FIG. 5 is a perspective view illustrating a structure of a board conveying segment, in the printing unit illustrated in FIG. 4.

As illustrated in FIG. 5, the conveying mechanism section 20 comprises a pair of base conveyers 21 each extending just above the base 10 (see FIG. 2) and along the X direction (board conveying direction) corresponding to the board conveying-in/conveying-out direction, and a board conveying segment 22 provided to clamp the pair of base conveyers 21 from thereoutside in such a manner as to be reciprocatingly displaceable relatively with respect to the base conveyers 21 and along the X direction. The base conveyers 21 have a conveyer belt (not illustrated) configured to be displaced in the X1 direction. Thus, the base conveyers 21 carries out a function of conveying a printed board 5 set on the board conveying-in side of the printing unit 90, to the standby zone (see FIG. 2) on the base conveyers 21, and a function of conveying the printed board 5 after completion of printing, from the printing zone to the conveying-out zone (see FIG. 2). The board conveying segment 22 has a role of conveying the printed board 5 set in the standby zone, to the printing zone while retaining the printed board 5.

The pair of base conveyers 21 are disposed opposed to and spaced apart from each other by a given distance in the Y direction (printing direction) approximately perpendicular to the X direction, wherein each of the base conveyers 21 extends from one of opposite edges of the base 10 (on the X1-directional side) to the other edge (on the X2-directional side). The board conveying segment 22 includes a board table 22a for placing a printed board 5 thereon, and a plurality of (in this embodiment, two) clamp fingers 22b provided on respective opposite lateral sides (Y1-directional and Y2-directional sides) of the board table 22a to temporarily retain the printed board 5 placed on the board table 22a, by clamping lateral end surfaces of the printed board 5 in the Y direction (Y1 and Y2 directions). The board table 22a has a plurality of pins (not illustrated) each attached to an upper surface (a surface oriented in a Z1 direction) thereof to extend upwardly from the upper surface. Therefore, the printed board 5 is placed on the board table 22a under a condition that a lower surface thereof is supported by the pins. The board conveying segment 22 is configured such that the board table 22a and the clamp fingers 22b are integrally displaced along the base conveyers 21.

Figure 6:
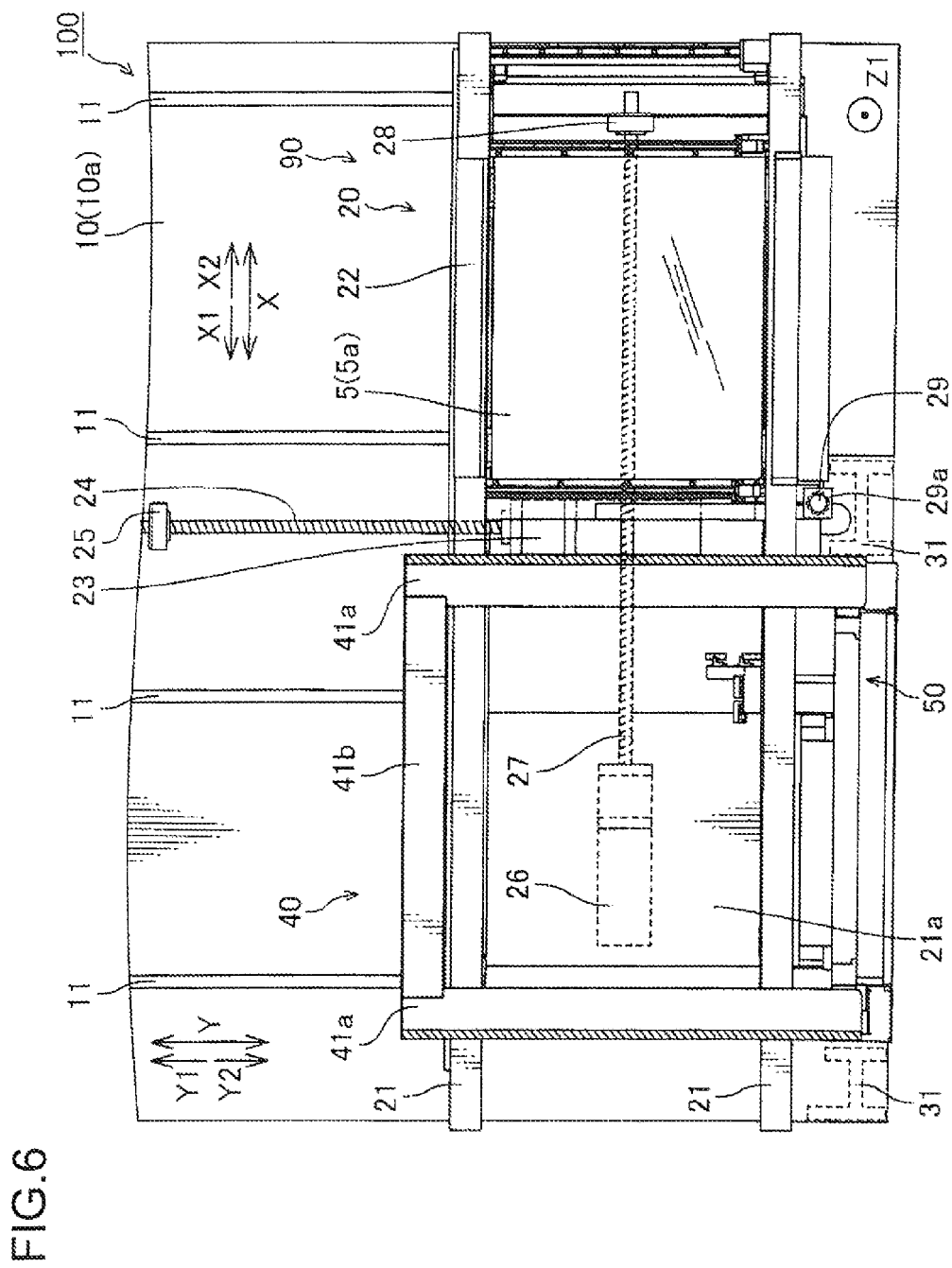
FIG. 6 is a top plan view illustrating a lower structure including a conveying mechanism section, in the front printing unit.

As illustrated in FIG. 6, the base 10 has four rails 11 each laid thereon to extend in the Y direction and disposed spaced apart from each other by a given distance in the X direction, and the conveying mechanism section 20 is placed on the four rails in a posture where it extends across the four rails 11 in the X direction along which each of the base conveyers 21 extends. Further, a servomotor 23, and a ball screw shaft 24 connected to a rotary shaft (Y shaft) of the servomotor 23, are provided between the conveying mechanism section 20 and the upper surface 10a of the base 10. In this embodiment, the servomotor 23 serves as one example of "driving source" set forth in the appended claims, and the ball screw shaft 24 serves as one example of "feed screw shaft" set forth in the appended claims.

The servomotor 23 is fixed to a lower surface of the conveying mechanism section 20 (a bottom 21a (see FIG. 7) of the base conveyers 21) under a condition that the rotary shaft thereof is aligned with the Y direction. The ball screw shaft 24 is rotatably fixed onto the upper surface 10a of the base 10 under a condition that it extends in the Y direction along the rotary shaft of the servomotor 23. As illustrated in FIGS. 4 and 6, a nut member 25 is attached to the upper surface 10a (see FIG. 6) of the base 10 at a position located on an extension line of the ball screw shaft 24, and the ball screw shaft 24 is screwed with and inserted into the nut member 25. Thus, when the ball screw shaft 24 is rotated by the servomotor 23, the servomotor 23 can be displaced in the Y direction (Y1 and Y2 directions) with respect to the nut member 25 fixed to the base 10. In other words, according to driving of the servomotor 23, the conveying mechanism section 20 having the servomotor 23 fixed thereto can be displaced on the rails 11 reciprocatingly in the Y direction. An allowable range of Y-directional displacement of the conveying mechanism section 20 is slightly less than a length of the ball screw shaft 24. In this embodiment, a combination of the servomotor 23, the ball screw shaft 24 and the nut member 25 serves as one example of "driving mechanism" set forth in the appended claims.

Figure 7:
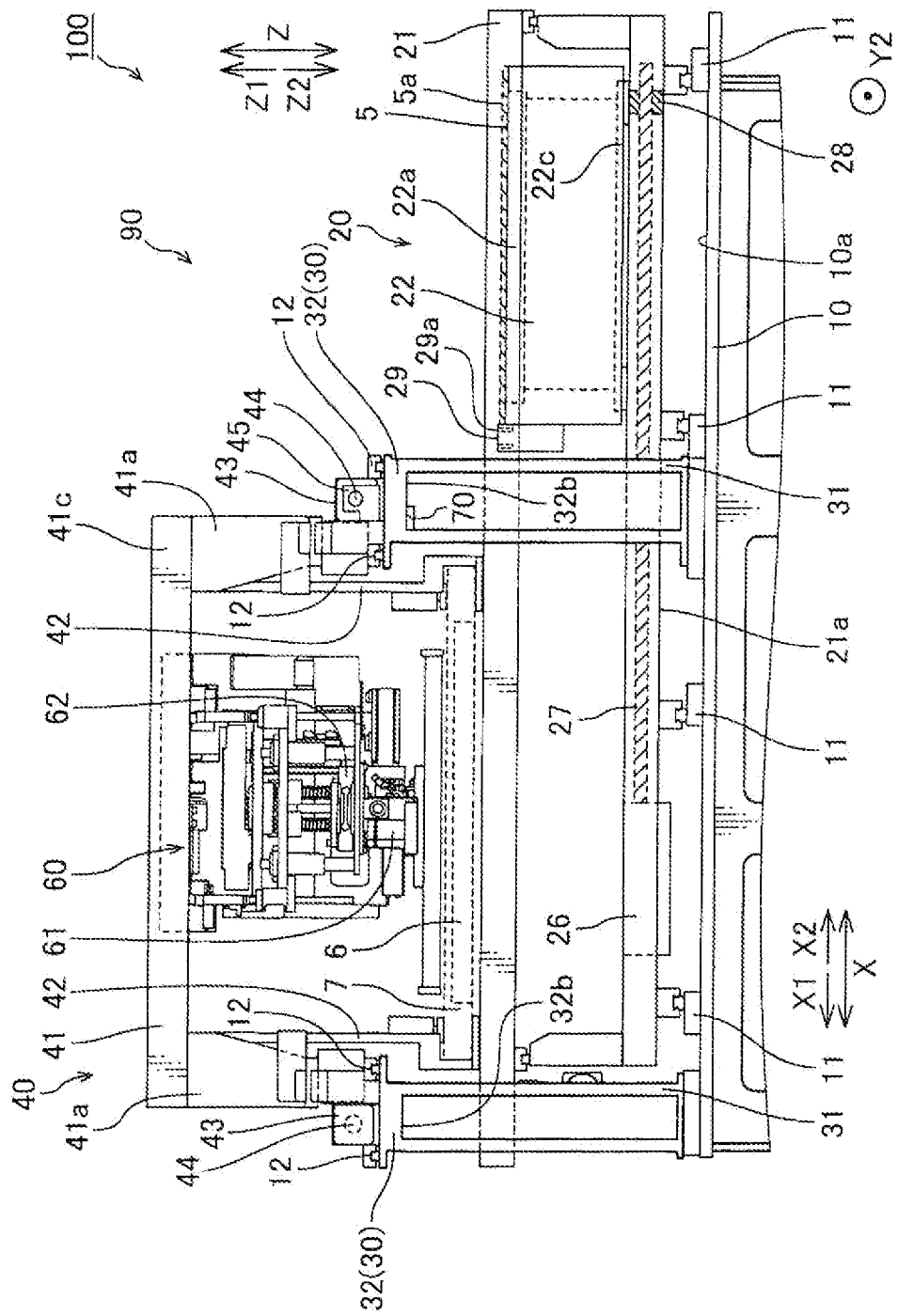
FIG. 7 is a side view illustrating the front printing unit, when viewed in a Y1 direction.

As illustrated in FIG. 6, a servomotor 26, and a ball screw shaft 27 connected to a rotary shaft (X shaft) of the servomotor 26, are provided in a region between the pair of base conveyers 21 opposed in the Y direction. The servomotor 26 is fixed to the bottom 21a of the base conveyers 21 under a condition that the rotary shaft thereof is aligned with the X direction. The servomotor 23 and the servomotor 26 are fixed to the bottom 21a at respective different positions. The ball screw shaft 27 is rotatably fixed below the bottom 21a of the base conveyers 21 under a condition that it extends in the X direction along the rotary shaft of the servomotor 26. As illustrated in FIG. 7, a nut member 28 is attached to a bottom 22c of the board conveying segment 22. In this embodiment, the servomotor 26 serves as one example of "driving source" set forth in the appended claims, and the ball screw shaft 27 serves as one example of "feed screw shaft" set forth in the appended claims. Further, a combination of the servomotor 26, the ball screw shaft 27 and the nut member 28 serves as one example of "driving mechanism" set forth in the appended claims.

The ball screw shaft 27 is screwed with and inserted into the nut member 28. Thus, when the ball screw shaft 27 is rotated by the servomotor 26, the nut member 28 can be displaced in the X direction (X1 and X2 directions). In other words, according to driving of the servomotor 26, the board conveying segment 22 having the nut member 28 fixed thereto can be displaced with respect to the base conveyers 21 reciprocatingly in the X direction. An allowable range of X-directional displacement of the board conveying segment 22 ranges from a region adjacent to one of opposite ends of the base conveyers 21 on the X1-directional side, to a region adjacent to the other end on the X2-directional side.

According to the driving mechanism having the above configuration, the board conveying segment 22 can be displaced to the standby zone on the base conveyers 21 on the board conveying-in side (X2-directional side) of the printing unit 90, and then displaced in the X1 direction while grasping, by the clamp fingers 22b, a printed board 5 conveyed to the standby zone on the base conveyers 21, for example, from other machine, so that the printed board 5 is conveyed to the printing zone, as illustrated in FIG. 2. Furthermore, the conveying mechanism section 20 can be reciprocatingly displaced on the upper surface 10a of the base 10 along the printing direction (Y direction) approximately perpendicular to the extending direction of the base conveyers 21, irrespective of an actual X-directional position of the board conveying segment 22. In other words, the board conveying segment 22 is configured to be controllably displaced in the X direction and the Y direction, based on a given operation pattern.

Further, the board conveying segment 22 is configured such that the board table 22a is lifted and lowered in an upward-downward direction (Z direction), according to driving of a non-illustrated driving mechanism provided therein. Thus, as illustrated in FIG. 7, a printed board 5 conveyed to the printing zone is displaced to a position lifted up with respect to an upper surface (a surface oriented in the Z1 direction) of the base conveyers 21 by a given heightwise distance, together with board table 22a. Then, the screen mask 6 retained by an aftermentioned mask retaining segment 42 will be lowered (displaced downwardly) and brought into contact with the upper surface 5a of the printed board 5 by a given pressing force.

The board conveying segment 22 is configured such that a Y-directional width thereof is selectively increased and reduced, according to driving of a non-illustrated driving mechanism provided therein. Thus, a printed board 5 can be retained by the clamp fingers 22b under a condition that the Y-directional width of the board conveying segment 22 is adjusted depending on a width (a length in the Y direction) of the printed board 5.

In this embodiment, as illustrated in FIGS. 4 and 7, a pair of the frame structures 30 are provided on the base 10 and disposed spaced apart from each other by a given distance in the X direction (board conveying direction). Each of the frame structures 30 has a portal shape which includes a plurality of (in this embodiment, two) leg portions 31 each extending upwardly from a vicinity of a respective one of the opposite ends (Y1-directional and Y2-directional ends) of the base 10 (see FIG. 6) in the Y direction (printing direction), and a beam portion 32 extending horizontally to connect the leg portions 31 opposed to each other in the Y direction, together. In order words, in a side view of the printing unit 90 when viewed in the X direction, the beam portion 32 extending in the Y direction strides over the conveying mechanism section 20 through the leg portions 31. Each of the leg portions 31 is fixed to the upper surfaces 10a of the base 10 (see FIG. 6) by a non-illustrated fastening member. The beam portion 32 in each of the pair of frame structures 30 has an upper surface 32a formed as a horizontal surface in the same manner as the upper surface 10a of the base 10. The upper surface 32a of the beam portion 32 has a rail 12 (see FIG. 4) provided thereon to extend in the Y direction. The printing mechanism section 40 is configured to be displaceable on the rails 12 fixed on the beam portions 32 along the Y direction, as described in detail later.

As illustrated in FIG. 5, a mask camera 29 is installed in the board conveying segment 22 of the conveying mechanism section 20.

The mask camera 29 is attached at a position on an outer side of the board table 22a, specifically, at a position on an outer side of one (Y1-directional) end of the board conveying segment 22 in a displacement direction and on an outer side of one (Y2-directional) end of the board conveying segment 22 in a direction perpendicular to the displacement direction, in a posture where a camera lens thereof is oriented upwardly (in the Z1 direction). The printing unit 90 is configured to, when the board conveying segment 22 retaining a printed board 5 is displaced in the X1 direction, monitor the mask openings (not illustrated) of the screen mask 6 (see FIG. 7), and detect a non-illustrated fiducial mark (alignment mark) provided on a lower surface of the screen mask 6, by using the mask camera 29. This makes it possible to accurately perform alignment between the screen mask 6 and the printed board 5 conveyed to the printing zone, in advance of printing. In this embodiment, the mask camera 29 serves as one example of "image pickup section" set forth in the appended claims.

In this embodiment, as illustrated in FIG. 7, a reference mark 70 is provided on a lower surface 32b (a surface oriented in the Z2 direction) of the beam portion 32 in one of the frame structures 30. Specifically, the reference mark 70 is disposed outside (on the X2-directional side with respect to) the printing zone where a printed board 5 is subjected to printing. As illustrated in FIG. 2, the reference mark 70 is provided on the lower surface 32b (see FIG. 7) of the beam portion 32 extending in the Y direction, at a given position falling within the range of Y-directional displacement of the conveying mechanism section 20 (the base conveyers 21). In other words, the reference mark 70 is provided at a position where an image thereof can be picked up by the mask camera 29 when the board conveying segment 22 being displaced in the horizontal plane (X-Y plane) together with the conveying mechanism section 20 passes through and under the beam portion 32 located in a non-printing zone outside the printing zone. The mask camera 29 is configured to pick up an image of the reference mark 70, irrespective of whether the board conveying segment 22 is conveyed with or without a printed board 5. Thus, it becomes possible to compensate for a strain of the conveying mechanism section 20 occurring along with the progress of the printing operation, at a timing appropriately determined by an aftermentioned processor section 81 (see FIG. 3). In this embodiment, the reference mark 70 serves as one example of "mark" set forth in the appended claims.

Figure 10:
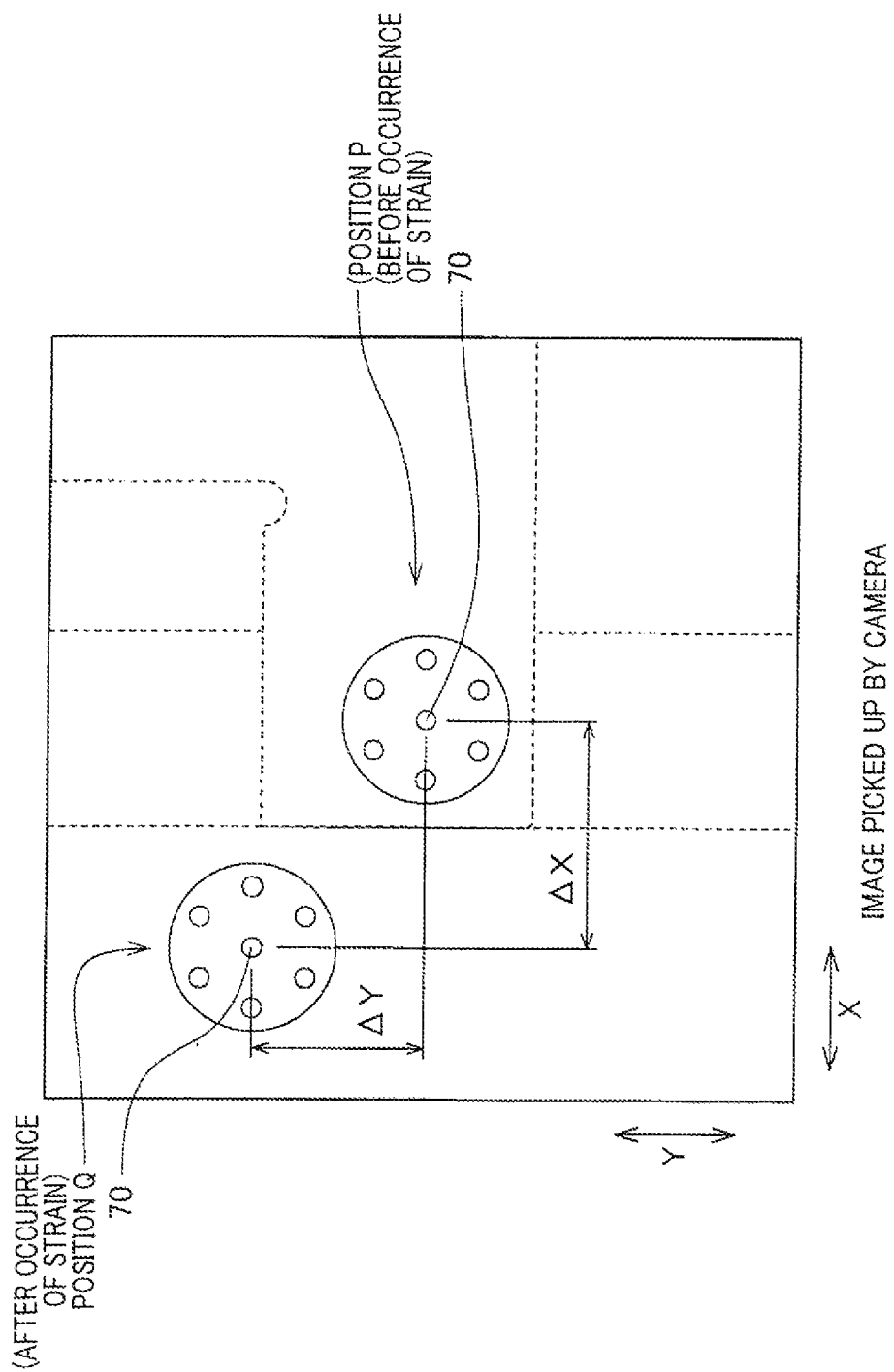
FIG. 10 is a schematic diagram illustrating a strain compensation process in the printing apparatus.

With reference to FIG. 10, a process of compensating for a strain of the conveying mechanism section 20 will be described below. Assuming that, during operation of the printing unit 90, according to an instruction of the aftermentioned processor section 81 (see FIG. 3), the board conveying segment 22 is displaced at a given timing to pick up an image of the reference mark 70 by the mask camera 29. In this case, a position of the reference mark 70 in the X-Y plane is set such that the reference mark 70 is imaged at a center of an image pickup field of view of the mask camera 29, when the ball screw shaft 27 is rotated in a rotational amount U by the servomotor 26, and the ball screw shaft 24 is rotated in a rotational amount V by the servomotor 23.

In this case, the rotational amount U is a rotational amount of the ball screw shaft 27 required for displacing the nut member 28 (board conveying segment 22) in the X1 direction from a position where the nut member 28 is located on one end (e.g., an X2-directional) end illustrated in FIG. 6) of the ball screw shaft 27, to a position where the center of the image pickup field of view of the mask camera 29 overlaps with the reference mark 70. The rotational amount V is a rotational amount of the ball screw shaft 24 required for displacing the servomotor 23 (the conveying mechanism section 20) in the Y2 direction from a position where the nut member 25 is located on one end (e.g., a Y2-directional end illustrated in FIG. 5) of the ball screw shaft 24, to a position where the center of the image pickup field of view of the mask camera 29 is aligned with the reference mark 70. The number of steps of the servomotor 26 corresponding to the rotational amount U, and the number of steps of the servomotor 23 corresponding to the rotational amount V, are stored in an aftermentioned control data storage section 82b (see FIG. 3) all together. Therefore, when the ball screw shafts 27, 24 are rotated by the respective rotational amounts U, V, the reference mark 70 will be imaged at a position P (central region) in the image pickup field of view, as illustrated in FIG. 10.

Assuming that, after a given number of printed boards 5 are repeatedly subjected to the printing, the board conveying segment 22 is displaced at a given timing to re-pick up an image of the reference mark 70 by the mask camera 29. In this case, the controller 80 in this embodiment is operable to rotate each of the servomotors 26, 23 by the number of steps stored during the last image pickup, so that the mask camera 29 (board conveying segment 22) is displaced from its initial position to an actual position to be set when each of the ball screw shafts 27, 24 is rotated by a rotational amount (U, V) corresponding to the stored number of steps. As a result, the reference mark 70 is imaged at a position Q in the image pickup field of view, as illustrated in FIG. 10. Although the reference mark 70 at the position P and the reference mark 70 at the position Q are actually imaged as separate image data, they are illustrated in the same figure for the sake of facilitating understanding on a change from the position P to the position Q.

During a process of continuously subjecting a plurality of printed boards 5 to the printing, each of the ball screw shafts 27, 24 driving the conveying mechanism section 20 has frictional heat caused by sliding with respect to a respective one of the nut members 28, 25 screwed therewith. Further, with a view to improving takt time (productivity), the conveying mechanism section 20 is controlled to be displaced in the X-Y plane at a relatively high speed. Thus, due to frictional heat caused by sliding between corresponding ones of the nut members and the ball screw shafts, each of the ball screw shafts 27, 24 undergoes thermal expansion in an axial direction thereof. Thus, even if each of the ball screw shafts 27, 24 is rotated by the same rotational amount (U, V) with respect to an initial position (reference position) for control, a displacement pitch of the nut member 28 (25) (a displacement amount of the nut member 28 (25) per 360-degree rotation of the ball screw shaft) is changed from a last value by an amount corresponding to thermal expansion of the ball screw shaft. Therefore, the position Q in FIG. 10 is imaged in offset relation to the position P.

Then, based on coordinates of the position P and coordinates of the position Q obtained by an image processing, a shift amount of the reference mark 70 from the position P to the position Q is calculated. In this case, an X-directional shift amount ΔX and a Y-directional shift amount ΔY are calculated. Then, based on a relationship between the shift amount ΔX and the rotational amount U, a thermal expansion coefficient of the ball screw shaft 27 corresponding to the X-directional shift amount of the reference mark 70 is determined. Further, Then, based on a relationship between the shift amount ΔY and the rotational amount V, a thermal expansion coefficient of the ball screw shaft 24 corresponding to the Y-directional shift amount of the reference mark 70 is determined. In the printing unit 90, it is necessary that the position Q (after occurrence of strain) and the position P (before occurrence of strain) of the reference mark 70 provided on the frame structure 30 fixedly installed to the base 10 coincide with each other. Thus, the respective rotational amounts of the ball screw shafts 27, 24 are adjusted while taking into account the calculated thermal expansion coefficients of the ball screw shafts.

The printing unit 90 is configured to adjust the respective rotational amounts of the ball screw shafts 27, 24, i.e., perform a strain compensation for the conveying mechanism section 20, in the above manner. Thus, even if the displacement pitch (displacement amount of the nut member 28 (25) per 360-degree rotation of the ball screw shaft) is changed due to thermal expansion occurring in the ball screw shaft 27 (24), the strain compensation can be performed (the rotational amount of the ball screw shaft 27 (24) can be adjusted) to accurately position the conveying mechanism section 20 (board conveying segment 22) in the X-Y plane.

In this embodiment, coordinates of (the position P in FIG. 10) the reference mark 70 obtained by subjecting an image of the reference mark 70 picked up by the mask camera 29 to an image processing is used as a reference position of position coordinates in the X-Y plane of the conveying mechanism section 20 (the base conveyers 21 and the board conveying segment 22) so as to drive the servomotors 23, 26 to displace the conveying mechanism section 20.

Figure 8:
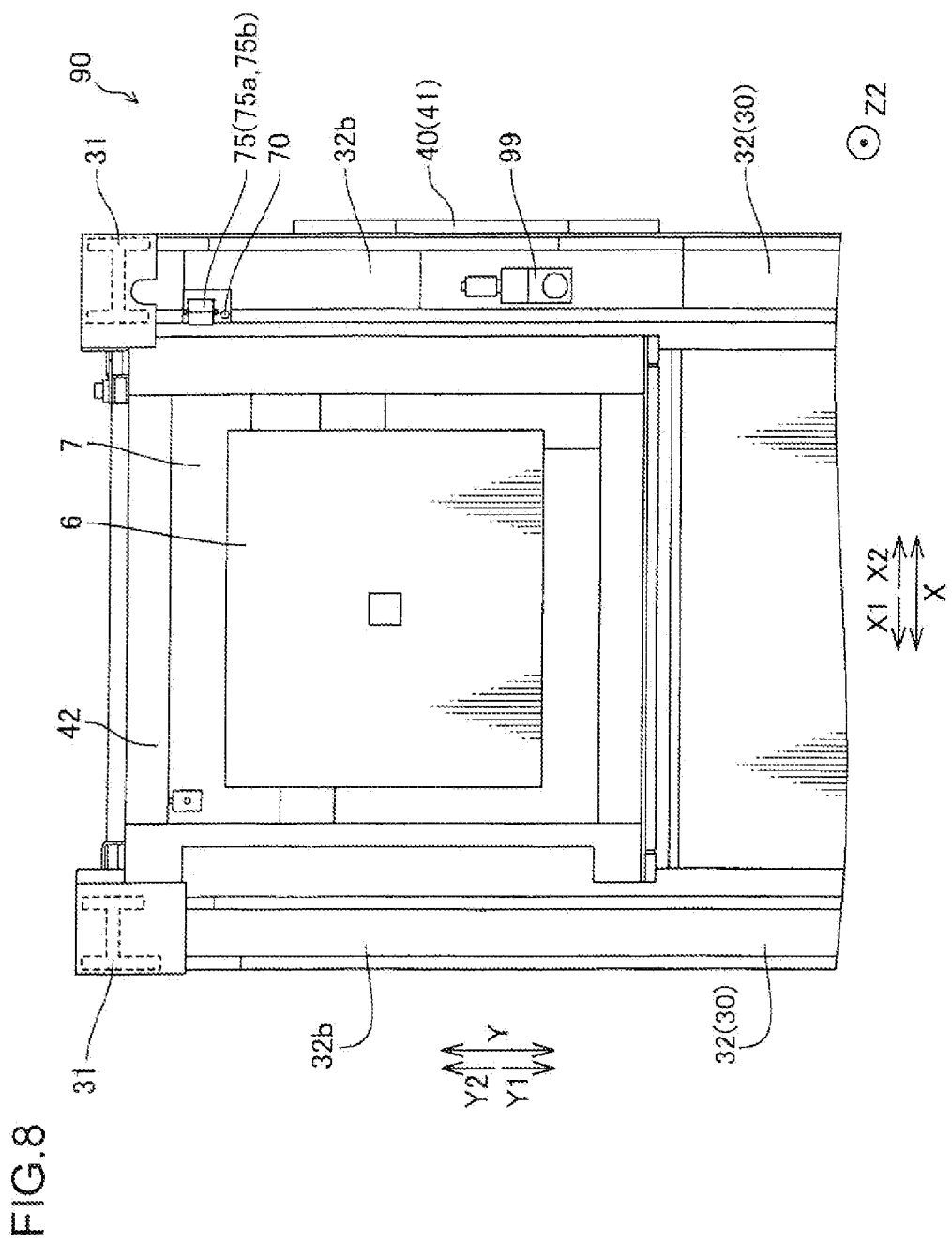
FIG. 8 is a plan view illustrating a frame structure of the front printing unit, when viewed from the side of a base (from the side of a lower surface of the front printing unit).
Figure 9:
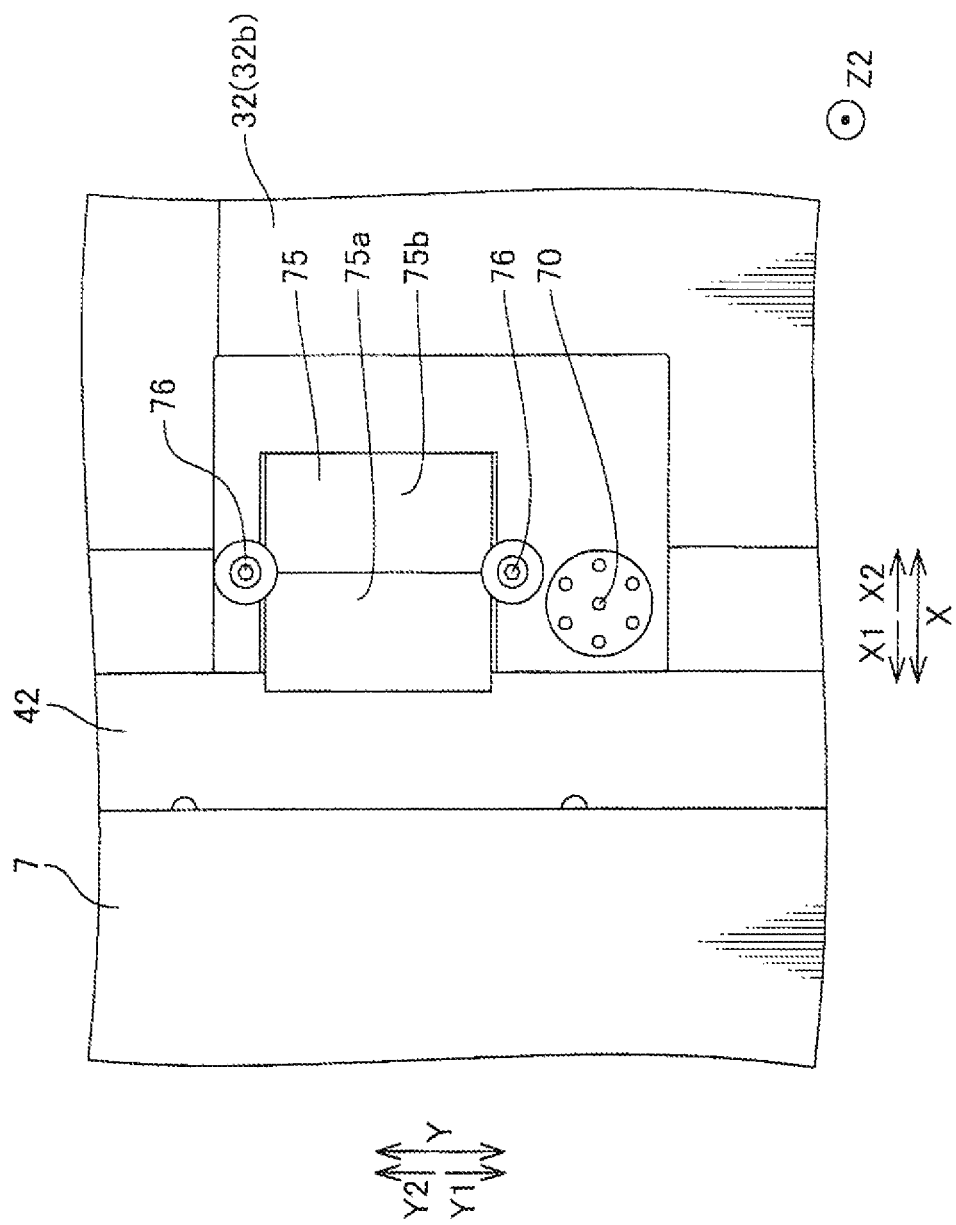
FIG. 9 is a plan view illustrating a mark provided on a beam portion of the frame structure illustrated in FIG. 8.

In this embodiment, as illustrated in FIGS. 8 and 9, a background plate 75 is provided on the lower surface 32b of the beam portion 32 in adjacent relation to the reference mark 70. The background plate 75 is fixed to the lower surface 32b of the beam portion 32 by two screw members 72 at respective positions adjacent to the reference mark 70. The background plate 75 has a first region 75a and a second region 75b which are painted with different colors. The mask camera 29 is equipped with an annular-shaped irradiation device (LED) 29a (see FIG. 7) for emitting illumination light toward a target (reference mark 70) during the image pickup, at a position adjacent to the camera lens (on the side of an upper surface of the mask camera 29). Thus, when the illumination light emitted from the irradiation device 29a is reflected by the first region 75a and the second region 75b of the background plate 75, and picked up by the mask camera 29, resulting images of the first and second regions 75a, 75b of the background plate 75 will be different in image quality. Therefore, based on an analysis result of an image of the background plate 75 irradiated with the illumination light, a luminance of the illumination light for use in picking up an image of the reference mark 70 by the mask camera 29 can be adequately adjusted. In this embodiment, the irradiation device (LED) 29a serves as one example of "illumination device" set forth in the appended claims.

As illustrated in FIG. 8, a board camera 99 is installed on the lower surface 32b of the beam portion 32. The board camera 99 is attached in a posture where a camera lens thereof is oriented downwardly (in the Z2 direction). The printing unit 90 is configured to, when the board conveying segment 22 retaining a printed board 5 is displaced in the X1 direction, pick up an image of a non-illustrated fiducial mark (alignment mark) provided on an upper surface 5a of the printed board 5, by using the board camera 99. This makes it possible to accurately perform alignment between the screen mask 6 and the printed board 5 conveyed to the printing zone, in advance of printing.

As illustrated in FIG. 4, the printing mechanism section 40 comprises: a printing mechanism support segment 41 composed of a frame structure configured to be displaceable on the upper surface 32a of the beam portion 32 in the Y direction; a mask retaining segment 42 attached inside the printing mechanism support segment 41 in such a manner as to be liftable and lowerable with respect to the printing mechanism support segment 41 (in the Z direction), while retaining the screen mask 6; and a printing segment 60 for printing solder onto a printed board 5 through the screen mask 6.

The printing mechanism support segment 41 has: a pair of sidewall portions 41a each extending upward from the upper surface 32a of the beam portion 32; a sidewall portion 41b extending in the X direction to connect between respective Y1-directional ends of the pair of sidewall portions 41a; and a beam portion 41c extending in the X direction to connect between respective upper ends of the pair of sidewall portions 41a. In other words, the printing mechanism support segment 41 has a portal structure, when the printing unit 90 is viewed from the front (Y2-directional) side in the Y direction.

A servomotor 43, and a ball screw shaft 44 connected to a rotary shaft of the servomotor 43, are provided on the upper surface 32a of the beam 32. The servomotor 43 is fixed to the upper surface 32a of the beam 32 under a condition that the rotary shaft thereof is aligned with the Y direction. The ball screw shaft 44 is rotatably fixed onto the upper surface 32a under a condition that it extends in the Y direction along the rotary shaft of the servomotor 43. A nut member 45 is attached to the sidewall portion 41a, and the ball screw shaft 44 is screwed with and inserted into the nut member 45. Thus, when the ball screw shaft 44 is rotated by the servomotor 43, the nut member 45 can be displaced in the Y direction (Y1 and Y2 directions). A combination of the servomotor 43, the ball screw shaft 44 and the nut member 45 is provided with respect to each of the upper surfaces 32a of the right and left (X-directionally opposed) beam portions 32. Thus, the right and left servomotors 43 are configured to be driven individually to allow the printing mechanism support segment 41 to be not only translated in the Y direction but also slightly rotated about the Z axis in the X-Y plane. This makes it possible to finely align the screen mask 6 retained by the mask retaining segment 42, with a printed board 5 conveyed into the printing zone, in the X-Y plane.

The mask retaining segment 42 attached to be liftable and lowerable with respect to the sidewall portions 41a of the printing mechanism support segment 41 in an upward-downward direction (Z direction), as mentioned above. Specifically, the printing mechanism support segment 41 incorporates a servomotor 46, and four ball screw shafts 47 each adapted to be rotationally driven by the servomotor 46 via a belt transmission mechanism. Correspondingly, the mask retaining segment 42 is provided with four nut members 48. Each of the ball screw shafts 47 is disposed to extend in the Z direction, and screwed with a respective one of the nut members 48. In other words, the mask retaining segment 42 is configured to be liftable and lowerable in the Z direction according to actuation of the servomotor 46. Thus, during printing, the screen mask 6 retained by the mask retaining segment 42 can be lowered in the Z2 direction, and brought into contact with an upper surface of a printed board 5 conveyed into the printed zone. On the other hand, after the printing, the screen mask 6 can be lifted in the Z1 direction, and released (separated away from) the upper surface 5a of the printed board 5.

As illustrated in FIG. 7, the printing segment 60 is disposed inside the printing mechanism support segment 41 having a portal structure. The printing segment 60 comprises a squeegee device 61 for pressing solder 2 (see FIG. 5) in paste form, against an upper surface (a surface oriented in the Z1 direction) of the screen mask 6 to push out the solder onto a printed board 5 through the plurality of mask openings (not illustrated) formed in the screen mask 6, and a solder supply device 62 for supplying the solder 2 onto the upper surface of the screen mask 6. The printing segment 60 is displaceably installed on an inner side surface of the mask retaining segment 42 by a non-illustrated support mechanism configured to support the squeegee device 61 and the solder supply device 62. Specifically, the printing segment 60 is configured to be reciprocatingly displaced to allow the squeegee device 61 to reciprocatingly displaced with respect to the mask retaining segment 42 in the printing direction (Y direction) so as to print the solder 2 onto the printed board 5.

The screen mask 6 (see FIG. 7) is made from a plate-shaped (sheet-shaped) member having a thickness of about 20 μm to about 150 μm, and formed to have an opening region with a plurality of openings (not illustrated) arranged in a certain pattern. Thus, the sheet-shaped screen mask 6 has flexibility, and thereby an outer periphery of the screen mask 6 is fixed to a frame 7 composed of a rigid member. The frame 7 has a size of about 750 mm on a side (about 750 mm×about 750 mm) at a maximum. The size of the frame 7 may be appropriately determined depending on a size of the screen mask 6. The printing unit 90 is configured to allow a user to open an access cover 101a (see FIG. 1), and insert and fix the frame 7 having the screen mask 6 fixed thereto, into and to the mask retaining segment 42.

As illustrated in FIG. 3, the controller 80 comprises a CPU (processor section) and a board circuit section. Specifically, the controller 80 primarily comprises a processor section 81, a storage section 82, an external input/output section 83, an image processing section 84 and a driving mechanism control section 85. In this embodiment, the processor section 81 serves as one example of "control section" set forth in the appended claims.

The processor section 81 is composed of a CPU, and operable to generally control operations of the printing unit 90. The storage section 82 includes an operation program storage section 82a which stores therein a control program and other programs executable by the processor section 81, and a control data storage section 82b which stores therein data required for performing a printing operation. In this embodiment, the operation program storage section 82a is composed of a flash ROM (Read Only Memory), and the control data storage section 82b is composed of a RAM (Random Access Memory).

The external input/output section 83 has a function of controlling input and output of signals of various operation control buttons such as a startup button 95, and various sensors (see FIG. 3) such as a squeegee position sensor, a mask position sensor and a board position sensor. The image processing section 84 has a role of subjecting image data acquired by the board camera 99 and the mask camera 29 to an image processing to internally create data required for operations of the printing unit 90. In this case, image data about the reference mark 70 acquired by the mask camera 29 is subjected to an image processing in the image processing section 84. The processor section 81 is configured to figure out a level of strain (elongation of each of the ball screw shafts 24, 27) based on the image-processed data.

The driving mechanism control section 85 is configured to, based on a control signal output from the processor section 8, control respective servomotors (such as the servomotor 26 (see FIG. 6) for displacing the board conveying segment 22 in the X direction, the servomotor 23 (see FIG. 6) for displacing the conveying mechanism section 20 in the Y direction, and the servomotor 46 (see FIG. 4) for displacing the mask retaining segment 42 in the Z direction) of the printing unit 90. The driving mechanism control section 85 is configured to further control a servomotor for a board conveying shaft (not illustrated) provided in the base conveyers 21. The driving mechanism control section 85 is configured to be capable of recognizing a position of the board conveying segment 22 in the X-Y plane, a height (Z-directional) position and a rotational position (about the Z axis) of the mask retaining segment 42, etc., based on signals from respective encoders provided in the servomotors.

The controller 80 is connected to an emergency stop circuit section 92 provided in the apparatus body. The emergency stop circuit section 92 is electrically connected with a cover-open switch 93 provided at a given position of an inside of the apparatus body, and a push button-type emergency stop button 94. The cover-open switch 93 is configured to be switchingly opened and closed depending on whether the access cover 101a (see FIG. 1) is in an opened state or in a closed state. Thus, when the access cover 101a is in the opened state, the emergency stop circuit section 92 becomes functional to prevent an operation of the printing unit 90 from being started (restarted). Further, if a user pushes the emergency stop button 94 during the operation, the emergency stop circuit section 92 becomes functional to immediately stop the operation.

The printing unit 91 (see FIG. 2) has substantially the same configuration as that of the printing unit 90. Thus, the printing apparatus 100 is configured such that, during driving of the printing units 90, 91, the strain compensation operation is performed for each of the printing units 90, 91, individually, depending on respective operation conditions.

As illustrated in FIG. 1, the printing apparatus 100 is exteriorly provided with a display panel 102 for each of the printing units 90, 91. The display panel 102 is configured to allow a user to figure out a status of the printing operation, and perform manual operations, according to information displayed thereon. The printing apparatus 100 is provided with an indicator lamp 103. The indicator lamp 103 is disposed at a position higher than a top portion of the printing apparatus 100, so that a user can visually check an operational status of the printing apparatus 100 even when the user is at a position far from the printing apparatus 100. The printing apparatus 100 is configured as above.

With reference to FIGS. 3 to 5 and FIGS. 7 and 8, an operation of the printing unit 90 in the printing apparatus 100 during the strain compensation will be described below.

In a state after a post-printing printed board 5 is conveyed in the X1 direction from the printing zone to the conveying-out zone by the board table 22a (see FIG. 5), the board conveying segment 22 is stopped in the printing zone (zone where the screen mask 6 (see FIG. 7) is placed on an upper surface 5a of a printed board 5 during the printing) under a condition that the clamp fingers 22b are released, and the board table 22a is lowered.

Assuming that a pre-printing printed board 5 is newly transferred to the standby zone on the base conveyers 21. In cases where the printing operation in the printing unit 90 is continued, the board conveying segment 22 stopped in the printing zone will be displaced along the base conveyers 21 in the X2 direction until it reaches the standby zone. Then, as illustrated in FIG. 5, after clamping the new printed board 5 using the clamp fingers 22b, the board conveying segment 22 is displaced in the X1 direction toward the printing zone again.

In this embodiment, as illustrated in FIG. 7, when the board conveying segment 22 passes through and under the beam portion 32, an image of the reference mark 70 provided on the lower surface 32b of the beam portion 32 is picked up by the mask camera 29. Based on this image, current position coordinates of the reference mark 70 in the X-Y plane is recognized. Further, when the board conveying segment 22 passes through and under the beam portion 32 in the X1 direction, an image of the non-illustrated fiducial mark provided on an upper surface 5a of the printed board 5 is picked up by the board camera 99 (see FIG. 8) provided on the lower surface 32b of the beam portion 32.

Subsequently, as illustrated in FIG. 4, the board conveying segment 22 is stopped in the printing zone, and the clamp fingers 22b are released. Then, the board table 22a is lifted (displaced in the Z1 direction), so that the printed board 5 is lifted up to a given height position under a condition that a lower surface of the printed board 5 is supported by the pins. Further, when the board conveying segment 22 is stopped in the printing zone, an image of the non-illustrated fiducial mark provided on the lower surface of the screen mask 6 is picked up by the mask camera 29.

Subsequently, based on the image of the fiducial mark of the printed board 5 picked up by the board camera 99 and the image of the fiducial mark of the screen mask 6 picked up by the mask camera 29, positioning of the mask retaining segment 42 (see FIG. 4) in the X-Y plane is performed. Then, in this state, the screen mask 6 (see FIG. 7) is lowered (displaced in the Z2 direction) together with the mask retaining segment 42, so that the screen mask 6 is brought into contact with the upper surface 5a of the printed board 5 with a given pressing force.

Subsequently, solder 2 (see FIG. 5) is supplied onto the screen mask 6, and the printing segment 60 (see FIG. 7) is driven, so that the solder 2 is printed onto the upper surface 5a of the printed board 5 through the screen mask 6.

After printing of the solder 2, the screen mask 6 is lifted (displaced in the Z1 direction) together with the mask retaining segment 42, and released from the upper surface 5a of the printed board 5. Then, the board table 22a is lowered (displaced in the Z2 direction), so that the printed board 5 is placed on the base conveyers 21. In the printing unit 90, the printing for a plurality of printed boards is continuously performed by repeating the above printing operation. During the series of printing operations, when the board conveying segment 22 passes through and under the beam portion 32, an image of the reference mark 70 is picked up at an adequate timing based on an instruction from the processor section 81 (see FIG. 3) to compensate for a strain of the conveying mechanism section 20.

As above, in the above embodiment, the printing apparatus 100 (printing unit 90 (91)) comprises the frame structure 30 fixedly installed on the base 10 and provided with the reference mark 70 for use in compensating for a strain of the conveying mechanism section 20, and the mask camera 29 for picking up an image of the reference mark 70, wherein the printing apparatus 100 is configured to pick up, by the mask camera 29, an image of the reference mark 70 provided on the lower surface 32b of the beam portion 32 of the frame structure 30, so as to perform the strain compensation. In other words, the printing apparatus 100 (printing unit 90 (91)) is configured to pick up, by the mask camera 29, an image of the reference mark 70 provided on the frame structure 30 which is not directly involved in the printing operation for a printed board 5 by the printing mechanism section 40, so as to perform the strain compensation. Therefore, the flexibility of timing of the strain compensation is improved, so that an image of the reference mark 70 can be picked up at a more adequate timing to perform the strain compensation. Thus, the printing apparatus 100 can stably maintain printing accuracy when the printing for a plurality of printed boards is continuously performed in the printing unit 90 (91).

In the above embodiment, the mask camera 29 is installed on the board conveying segment 22, and adapted to be displaced in a horizontal plane (X-Y plane) together with the board conveying segment 22. Thus, the mask camera 29 can be displaced in conjunction with displacement of the board conveying segment 22 so as to pick up an image of the reference mark 70 provided on the lower surface of the beam portion 32, at an adequate timing. This makes it possible to eliminate a need for additionally providing a special driving mechanism for displacing the mask camera 29, and therefore structurally simplify the printing apparatus 100 (printing unit 90 (91)).

In the above embodiment, the frame structure 30 is disposed outside the printing zone where a printed board 5 is subjected to the printing (a zone where the screen mask 6 is placed on a printed board 5 during the printing), and therefore the mask camera 29 is operable to pick up an image of the reference mark 70 in a non-printing zone outside the printing zone. As above, the mask camera 29 picks up an image of the reference mark 70 for the strain compensation, in the non-printing zone which is not directly involved in the printing operation for a printed board 5, so that the operation of picking up an image of the reference mark 70 is never performed in the printing zone. Thus, the printing apparatus 100 can perform the strain compensation without exerting an influence directly on the printing operation for a printed board 5.

In the above embodiment, the printing apparatus 100 comprises the servomotor 23 for driving the entire conveying mechanism section 20 in the Y direction, the servomotor 26 for driving the board conveying segment 22 in the X direction, and the processor section 81 for performing a compensation for thermal strain of each of the ball screw shafts 24, 27, based on an image of the reference mark 70 picked up by the mask camera 29. Thus, based on the image of the reference mark 70 picked up by the mask camera 29, the printing apparatus 100 can perform the compensation for thermal strain of each of the ball screw shafts 24, 27 at an adequate timing.

In the above embodiment, based on the image of the reference mark 70 picked up by the mask camera 29, the processor section 81 is operable to compensate for a strain of the ball screw shaft 27 (24) screwed with the board conveying segment 22. Specifically, even if thermal elongation occurs in the ball screw shaft 27 (24) for transmitting a driving force to the board conveying segment 22, the processor section 81 can perform a correction of a rotational amount of the ball screw shaft 27 (24) depending on the strain of the ball screw shaft 27 (24), at a timing adequate for performing the strain compensation. Thus, the printing apparatus 100 can accurately perform an operation of conveying a printed board 5 by the board conveying segment 22.

In the above embodiment, the ball screw shaft 27 (24) extends from the printing zone where a printed board 5 is subjected to the printing, to the non-printing zone outside the printing zone, and the board conveying segment 22 is screwed with the elongate ball screw shaft 27 (24), wherein the board conveying segment 22 is configured to be displaced between the printing zone and the non-printing zone according to driving of the ball screw shaft 27 (24). The printing apparatus 100 is capable of performing the correction of the rotational amount of the ball screw shaft 27 (24) depending on the strain of the ball screw shaft 27 (24), at a timing adequate for performing the strain compensation, as mentioned above. Thus, even using such an elongate ball screw shaft 27 (24), it becomes possible to stably maintain printing accuracy.

In the above embodiment, the processor section 81 is operable to control the driving of the board conveying segment 20, using coordinates of the image of the reference mark 70 picked up by the mask camera 29, as a reference position of position coordinates of the conveying mechanism section 20 (the base conveyers 21 and the board conveying segment) in the X-Y plane. In other words, driving of the servomotor 26 (23) is controlled using coordinates of the reference mark 70 as a reference position for control. In the printing apparatus 100 configured to control the driving of the board conveying segment 20, using coordinates of the reference mark 70 as a reference position, even if a component, such as the servomotor 26 (23) or the ball screw shaft 27 (24), is replaced, a new servomotor 26 (23) can be readily driven only by setting coordinates of the reference mark 70 as a reference position for control.

In the above embodiment, the mask camera 29 is operable to pick up an image of the reference mark 70 during the operation of conveying a printed board 5 into the printing zone by the board conveying segment 22. This means that, in the printing apparatus 100, the operation of picking up an image of the reference mark 70 is included in the board conveying operation by the board conveying segment 22. Thus, the printing apparatus 100 can shorten a time required for picking up an image of the reference mark 70, so that it becomes possible to reduce a takt time in the printing apparatus 100.

In the above embodiment, the mask camera 29 is operable to pick up an image of the reference mark 70 during displacement of the board conveying segment 22 in the operation of conveying a printed board 5 into the printing zone by the board conveying segment 22. Thus, the printing apparatus 100 can pick up an image of the reference mark 70 during displacement of the board conveying segment 22, so that it becomes possible to shorten the time required for picking up an image of the reference mark 70, and thus reduce the takt time in the printing apparatus 100 easily and effectively.

In the above embodiment, the frame structure 30 is fixedly installed to support the mask retaining segment 42 retaining the screen mask, displaceably in a direction (Y direction) intersecting with the board conveying direction (X direction) of the board conveying segment 22, and the mask camera 29 is operable, when the board conveying segment 22 is displaced along a conveyance path for a printed board 5, to pick up an image of the reference mark 70 provided on the frame structure 30. As above, in the printing apparatus 100, the reference mark 70 for the strain compensation is provided on the fixedly installed frame structure 30, so that, even if the mask retaining segment 42 is supported by the frame structure 30 displaceably in the direction intersecting with the board conveying direction of the board conveying segment 22, the strain compensation can be reliably performed at an adequate timing.

In the above embodiment, an image of the reference mark 70 for the strain compensation is picked up using the mask camera 29 provided for monitoring (inspecting) a surface of the screen mask 6, so that it becomes possible to eliminate a need for additionally providing an "image pickup section" for picking up an image of the reference mark 70 for the strain compensation.

In the above embodiment, the reference mark 70 is provided on the lower surface 32b of the frame structure 39, and the mask camera 29 is installed on the board conveying segment 22 to become possible to pick up an image of the reference mark 70 from therebelow (in the Z1 direction). Thus, when the board conveying segment 22 passes through and under the frame structure 30 on a displacement path thereof in the X-Y direction, an image of the reference mark 70 provided on the lower surface 32b can be reliably picked up by the mask camera 29.

In the above embodiment, in addition to the reference mark 70, the frame structure 30 is provided with the background plate 75 in adjacent relation to the reference mark 70 to adjust a luminance of illumination light. Further, during the operation of picking up an image of the reference mark 70 by the mask camera 29, the processor section 81 is operable to perform control to adjust the luminance of the illumination light based on an image of the background plate 75 irradiated with the illumination light and picked up by the mask camera 29. This makes it possible to adjust the luminance of the illumination light to be emitted from the mask camera 29, while picking up an image of the reference mark 70, and therefore accurately pick up an image of the reference mark 70. Thus, the strain compensation can be accurately performed. As above, the luminance of the illumination light can be adjusted while picking up an image of the reference mark 70. Thus, as for the mask camera 29, a time required for the adjustment of the illumination light (takt loss) can be minimized. This makes it possible to shorten the takt time in the printing apparatus 100.

It should be understood that the above embodiment has been disclosed by way of illustration only, and not by way of limitation. The scope of the invention is not limited by the description of the above embodiment but determined by the appended claims. Further, the invention is intended to cover all changes and modifications thereof which are included in the scope of the appended claims and their legal equivalents.

For example, although the above embodiment has been described based on an example where an image of the reference mark 70 is picked up during the operation of conveying a printed board into the printing zone by the board conveying segment 22, the present invention is not limited thereto. As long as the "mark" set forth in the appended claims is provided in the non-printing zone outside the printing zone, an image of the reference mark 71 may be picked up, for example, during an operation of conveying a post-printing printed board 5 out of the printing zone by the board conveying segment 22.

Figure 11:
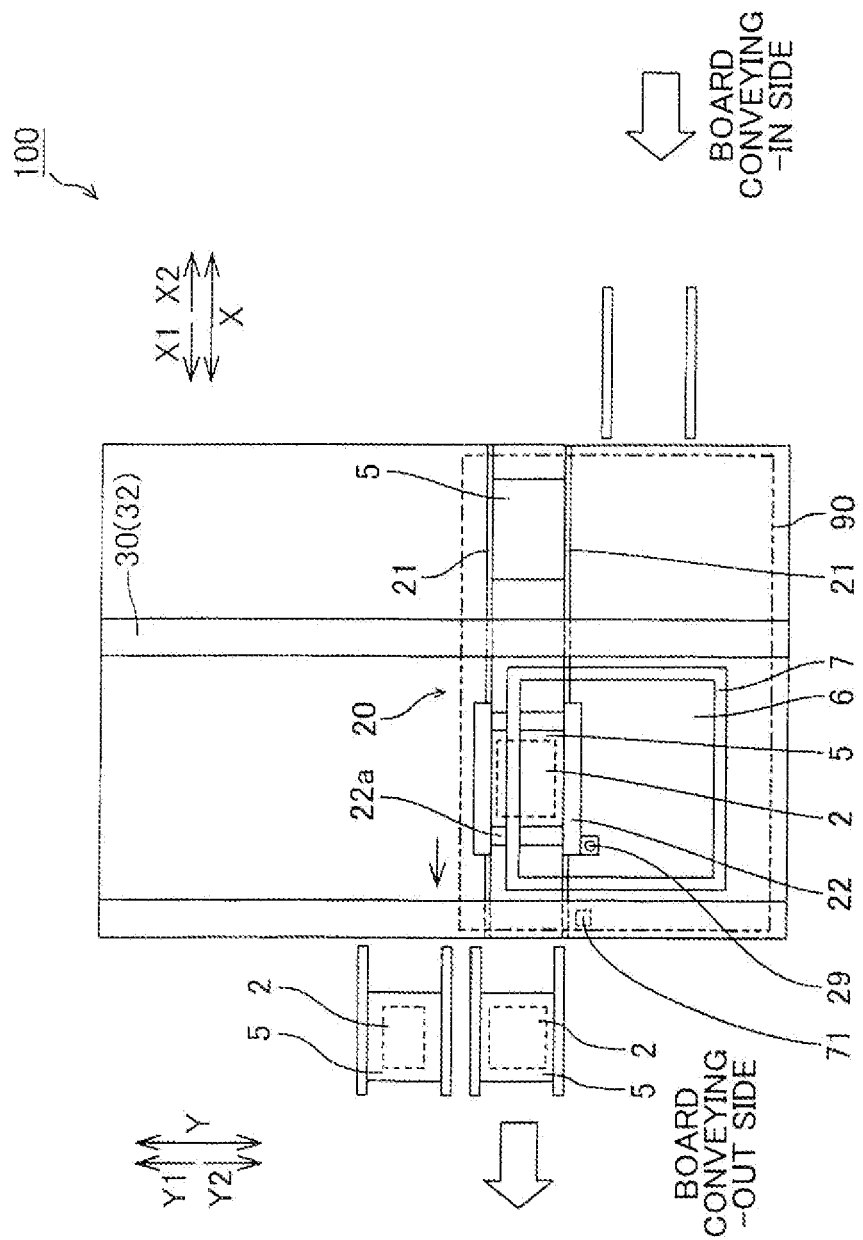
FIG. 11 is a top plan view illustrating a schematic layout of a first example of modification of the printing apparatus according to the above embodiment.

Specifically, as illustrated in FIG. 11 which is a first example of modification of the above embodiment, a reference mark 71 (indicated by the broken line) may be provided on a lower surface of the beam portion 32 of the frame structure 30 disposed on the left side (conveying-out side) in FIG. 11). In this case, the operation of picking up an image of the reference mark by the mask camera 29 is performed during a course of displacing the conveying mechanism section 20 (board conveying segment 22) mounting thereon a post-printing printed board 5, in the Y1 direction by a given distance. After the conveying mechanism section 20 is displaced in the Y1 direction by a given distance, the printed board 5 is conveyed on the base conveyers 21 in the X1 direction and conveyed outside the printing unit 90. In this first modified embodiment, the operation of picking up an image of the reference mark 71 can be included in the board conveying operation by the conveying mechanism section 20, so that it becomes possible to shorten the takt time in the printing apparatus 100. In FIG. 11, illustration of the printing unit 91 (see FIG. 2) provided on the Y1-directional side of the printing unit 90 is omitted only for convenience of explanation.

Alternatively, both of the reference mark 70 illustrated in the above embodiment and the reference mark 71 illustrated in the first modified embodiment may be provided in the printing unit 90. In this case, during the strain compensation, based on an instruction from the processor section 81, an image of either one of the reference marks 70, 71 may be picked up by the mask camera 29 to perform the strain compensation. Preferably, during the strain compensation, an image of one of the reference marks 70, 71 located closer to the mask camera 29 being operated (displaced) is picked up. This makes it possible to further shorten the time required for the strain compensation.

Figure 12:
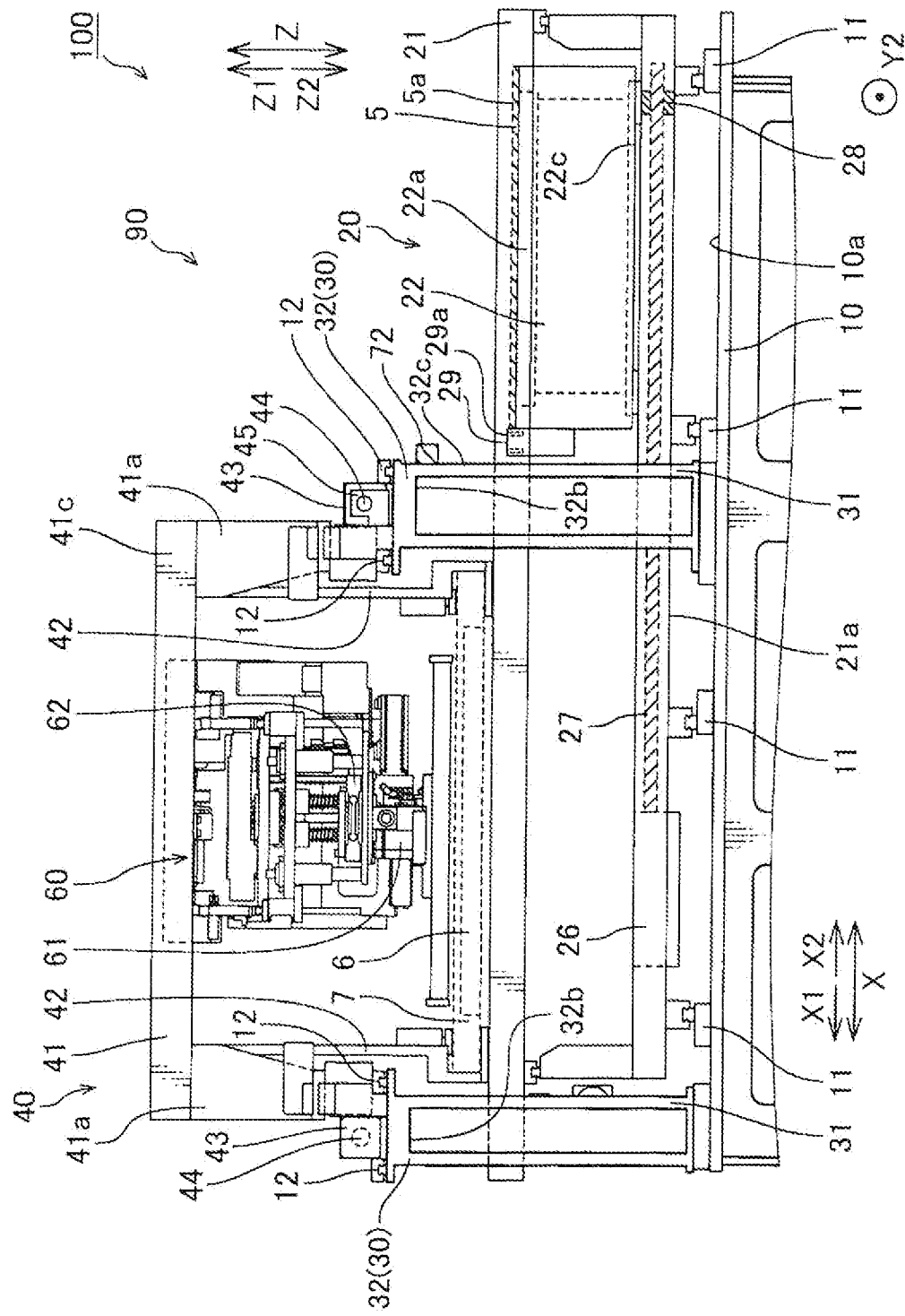
FIG. 12 is a side view illustrating a second example of the modification of the printing apparatus according to the above embodiment, when viewed in the Y1 direction.

Although the above embodiment has been described based on an example where the reference mark 70 is provided on the lower surface 32b of the beam portion 32, the present invention is not limited thereto. For example, as illustrated in FIG. 12 which is a second example of the modification of the above embodiment, as long as the mask camera 29 is capable of picking up an image of a target from therebelow, a reference mark 72 may be provided on a side surface 32c of the beam portion 32.

Although the above embodiment has been described based on an example where each of the base conveyers 21 and the board conveying segment 22 of the conveying mechanism section 20 is driven using the nut member and the ball screw shaft driven by the servomotor, the present invention is not limited thereto. Instead of the combination of the ball screw shaft and the nut member, the conveying mechanism section 20 (the base conveyers 21 and the board conveying segment 22) may be driven using any other suitable driving mechanism, such as a belt driving, or a combination of a rack gear and a pinion gear. In this case, while it is also necessary to perform a strain compensate for thermal elongation of a belt member or a rack gear, along with driving, such compensate for a strain of the driving mechanism can be performed at an appropriate timing.

Although the above embodiment has been described based on an example where the strain compensation is performed based on an instruction from the processor section 81 of the controller 80 in each of the printing units 90, 91, the present invention is not limited thereto. The "control section" set forth in the appended claims may be configured to generally control operations of both of the printing units 90, 91 in the printing apparatus 100. In this case, the strain compensation in each of the printing units can be performed at an adequate timing, based on a status of interoperation between the printing units 90, 91 (positional relationship between respective conveying mechanism sections 20 on the base 10), instead of a status of a respective one of the printing units.

The outline of the present invention described above is as follows.

According to one aspect of the present invention, there is provided a printing apparatus which comprises: a base; a frame member fixedly installed on the base; a printing section supported by the frame member to subject a board to printing; a board conveying segment provided on the base displaceably within a range including a printing zone where the printing is performed by the printing section, to convey a board; a driving mechanism for driving the board conveying segment; a control section for controlling the driving of the board conveying segment by the driving mechanism; a mark provided on the frame member; and an image pickup section mounted on the board conveying segment to pick up an image of the mark, wherein the control section is operable to cause the board conveying segment to be displaced so as to allow a board to be set in the printing zone, and, based on the image of the mark picked up by the image pickup section, to perform a strain compensation for correcting an error in displacement of the board conveying segment due to a strain of the driving mechanism.

In the printing apparatus of the present invention, an image of the mark provided on the frame member is picked up by the image pickup section mounted on the board conveying segment, during displacement of the board conveying segment, and the control section performs the strain compensation based on the image of the mark. In the printing apparatus of the present invention, the image pickup section picks up an image of the mark provided on the frame member which is not directly involved in the printing operation for a printed board by the printing section, so that an image of the mark can be picked up at an adequate timing to perform the strain compensation. Thus, it becomes possible to stably maintain printing accuracy when the printing for a plurality of printed boards is continuously performed in the printing apparatus. In addition, an image of the mark can be picked up while displacing the image pickup section in conjunction with displacement of the board conveying segment, so that it becomes possible to eliminate a need for additionally providing a special driving mechanism for displacing the image pickup section, and therefore structurally simplify the printing apparatus.

Preferably, in the printing apparatus of the present invention, the frame member is disposed outside the printing zone, and the image pickup section is operable to pick up an image of the mark during conveyance of a board by the board conveying segment.

According to this feature, the image pickup section picks up an image of the mark for the strain compensation, in a non-printing zone outside the printing zone, which is not directly involved in the printing operation for a board, so that, differently from cases where an image of the mark is picked up within the printing zone, the strain compensation can be performed without exerting an influence directly on the printing operation for a board.

Preferably, in the printing apparatus of the present invention, the driving mechanism is a screw feed mechanism comprising a driving source and a feed screw shaft adapted to be rotated by a driving force received from the driving source, wherein the driving mechanism is configured to displace the board conveying segment along with the rotation of the feed screw shaft, and the control section is operable, based on the image of the mark picked up by the image pickup section, to perform a strain compensation for correcting an error in displacement of the board conveying segment due to a strain of the feed screw shaft.

According to this feature, even if thermal elongation occurs in the feed screw shaft, a compensation for a strain of the feed screw shaft, i.e., a correction of a rotational amount of the feed screw shaft depending on the strain of the feed screw shaft, at an adequate timing. Thus, it becomes possible to accurately perform an operation of conveying a board by the board conveying segment.

In this printing apparatus, the feed screw shaft may extend from the printing zone to a non-printing zone outside the printing zone, and the board conveying segment may be provided with a nut member into which the feed screw shaft is inserted, where the board conveying segment may be configured to be displaced between the printing zone and the non-printing zone outside the printing zone, along with the rotation of the feed screw shaft.

This printing apparatus is capable of compensating for a strain of the feed screw shaft at a timing adequate, as mentioned above. Thus, even if the printing apparatus has such an elongate feed screw shaft extending from the printing zone to the non-printing zone, it becomes possible to effectively have the effects of the present invention.

Preferably, the printing apparatus of the present invention, the control section is operable to control the driving of the board conveying segment, using coordinates of the image of the mark picked up by the image pickup section, as a reference position of position coordinates of the board conveying segment.

According to this feature, coordinates of the mark is used as a reference position. Thus, even if a component, such as the driving source or the feed screw shaft, is replaced, the driving mechanism can be readily driven only by setting coordinates of the mark as a reference position for control.

Preferably, in the printing apparatus of the present invention, the image pickup section is operable to pick up an image of the mark during at least one of an operation of conveying a board into the printing zone by the board conveying segment, and an operation of conveying the board out of the printing zone by the board conveying segment.

According to this feature, the operation of picking up an image of the mark can be included in the board conveying operation by the board conveying segment, so that it becomes possible to shorten a time required for picking up an image of the mark. This makes it possible to shorten a takt time in the printing apparatus.

Preferably, in this printing apparatus, the image pickup section is operable to pick up an image of the mark during displacement of the board conveying segment.

According to this feature, an image of the mark is picked up during displacement of the board conveying segment, so that it becomes possible to shorten the time required for picking up an image of the mark. This makes it possible to shorten an operating time (takt time) in the printing apparatus easily and effectively.

Preferably, in the printing apparatus of the present invention, the frame member has a beam portion which strides over a board conveyance path of the board conveying segment, wherein the printing section is supported by the beam portion of the frame member, and the image pickup section is operable to pick up an image of the mark when a board is conveyed along the board conveyance path.

According to this feature, the printing section is provided in the beam portion of the frame member, and an image of the mark provided on the frame member is picked up when the board conveying segment passes through and under the beam portion, so that it becomes possible to reliably perform the strain compensation at an adequate timing.

More preferably, in this printing apparatus, the printing section comprises a screen mask adapted to be placed on an upper surface of a board during the printing, wherein the image pickup section is disposed to be capable of picking up an image of a lower surface of the screen mask, and operable to pick up an image of the mark while picking up the image of the lower surface of the screen mask.

According to this feature, an image of the mark for the strain compensation can be picked up using the image pickup section provided for monitoring (inspecting) a surface of the screen mask, so that it becomes possible to eliminate a need for additionally providing an image pickup section for picking up an image of the mark for the strain compensation.

More preferably, in the above printing apparatus, the mark is provided on a lower surface of the beam portion of the frame member, or on a side surface of the frame member.

According to this feature, when the board conveying segment passes through the vicinity of the frame member on a displacement path thereof in the X-Y direction, an image of the mark provided on the lower surface of the beam portion of the frame member or on the side surface of the frame member can be reliably picked up by the image pickup section.

Preferably, in the printing apparatus of the present invention, the image pickup section comprises an illumination device capable of emitting illumination light toward a target, and the frame member has a background plate disposed adjacent to the mark, wherein the control section is operable to adjust a luminance of the illumination light based on an image of the background plate picked up by the image pickup section together with the image of the mark.

According to this feature, it becomes possible to adjust the luminance of the illumination light to be emitted from the illumination device, while picking up an image of the mark, and therefore accurately pick up an image of the mark. Thus, the strain compensation can be accurately performed. As above, the luminance of the illumination light can be adjusted while picking up an image of the mark. Thus, a time required for the adjustment of the illumination light (takt loss) can be minimized. This also makes it possible to shorten the takt time in the printing apparatus.

This application is based on Japanese Patent application No. 2011-107808 filed in Japan Patent Office on May 13, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A printing apparatus comprising:
  a base;
  a frame member fixedly installed on the base;
  a printer supported by the frame member to subject a board to printing;
  a board conveyer provided on the base displaceably within a range including a printing zone where the printing is performed by the printer, to convey the board;
  a driver for driving the board conveyer;
  a controller configured to control the driving of the board conveyer by the driver;
  a mark provided on the frame member; and
  an image pickup section mounted on the board conveyer to pick up an image of the mark,
  wherein the controller is configured to cause the board conveyer to be displaced so as to allow the board to be set in the printing zone, and, based on the image of the mark picked up by the image pickup section, to perform a strain compensation for correcting an error in displacement of the board conveyer due to a strain of the driver,
  the image pickup section comprises an illuminator capable of emitting illumination light toward the mark,
  the frame member has a background plate disposed adjacent to the mark, and
  the controller is configured to adjust a luminance of the illumination light based on an image of the background plate picked up by the image pickup section together with the image of the mark.

2. The printing apparatus according to claim 1, wherein:
  the frame member is disposed outside the printing zone; and
  the image pickup section is operable to pick up the image of the mark during conveyance of the board by the board conveyer.

3. The printing apparatus according to claim 1, wherein:
  the driver is a screw feed mechanism comprising a driving force generator and a feed screw shaft adapted to be rotated by a driving force received from the driving force generator, the driver being configured to displace the board conveyer along with the rotation of the feed screw shaft; and
  the controller is operable, based on the image of the mark picked up by the image pickup section, to perform the strain compensation for correcting the error in displacement of the board conveyer due to a strain of the feed screw shaft.

4. The printing apparatus according to claim 3, wherein:
  the feed screw shaft extends from the printing zone to a non-printing zone outside the printing zone; and
  the board conveyer is provided with a nut member into which the feed screw shaft is inserted, the board conveyer being configured to be displaced between the printing zone and the non-printing zone outside the printing zone, along with the rotation of the feed screw shaft.

5. The printing apparatus according to claim 1, wherein the controller is operable to control the driving of the board conveyer using coordinates of the image of the mark picked up by the image pickup section as a reference position of position coordinates of the board conveyer.

6. The printing apparatus according to claim 1, wherein the image pickup section is operable to pick up the image of the mark during at least one of a first operation of conveying the board into the printing zone by the board conveyer, and a second operation of conveying the board out of the printing zone by the board conveyer.

7. The printing apparatus according to claim 1, wherein the image pickup section is operable to pick up the image of the mark during displacement of the board conveyer.

8. The printing apparatus according to claim 1, wherein the frame member has a beam portion which strides over a board conveyance path of the board conveyer, and wherein:

the printer is supported by the beam portion of the frame member; and the image pickup section is operable to pick up the image of the mark when the board is conveyed along the board conveyance path.

9. The printing apparatus according to claim 8, wherein the printer comprises a screen mask adapted to be placed on an upper surface of the board during the printing, and wherein the image pickup section is disposed to be capable of picking up an image of a lower surface of the screen mask, and operable to pick up the image of the mark while picking up the image of the lower surface of the screen mask.

10. The printing apparatus according to claim 8, wherein the mark is provided on a lower surface of the beam portion of the frame member, or on a side surface of the frame member.

* * * * *